(12) United States Patent
Dhong et al.

(10) Patent No.: US 7,746,140 B2
(45) Date of Patent: Jun. 29, 2010

(54) SCANNABLE LATCH

(75) Inventors: Sang Hoo Dhong, Austin, TX (US); Joel A. Silberman, Somers, NY (US); Osamu Takahashi, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 791 days.

(21) Appl. No.: 11/550,997

(22) Filed: Oct. 19, 2006

(65) Prior Publication Data

US 2007/0079193 A1 Apr. 5, 2007

Related U.S. Application Data

(62) Division of application No. 10/982,112, filed on Nov. 5, 2004, now Pat. No. 7,170,328.

(51) Int. Cl.
*H03K 3/289* (2006.01)
*H03K 3/356* (2006.01)

(52) U.S. Cl. .................. 327/218; 327/208; 326/98; 714/726

(58) Field of Classification Search .................. None
See application file for complete search history.

(56) References Cited

U.S. PATENT DOCUMENTS

| | | | | |
|---|---|---|---|---|
| 4,797,838 A | * | 1/1989 | Nelson et al. | 326/94 |
| 5,272,397 A | * | 12/1993 | Chen et al. | 326/97 |
| 5,870,411 A | * | 2/1999 | Durham et al. | 714/724 |
| 6,201,415 B1 | * | 3/2001 | Manglore | 326/98 |
| 6,925,590 B2 | * | 8/2005 | Campbell | 714/726 |
| 2003/0226077 A1 | * | 12/2003 | Zyuban et al. | 714/726 |

* cited by examiner

*Primary Examiner*—Tuan Lam
(74) *Attorney, Agent, or Firm*—Dillon & Yudell LLP

(57) ABSTRACT

A scannable latch is disclosed. The scannable latch includes a dynamic circuit, two cross-coupled NAND gates coupled to the dynamic circuit, and a pair of stacked transistors coupled to the dynamic circuit. One of the stacked transistors is for receiving data signals, and the other stacked transistors is for receiving scan in signals.

7 Claims, 6 Drawing Sheets

SCANNABLE LATCH

CROSS-REFERENCE TO A RELATED APPLICATION

The present application is a divisional of U.S. patent application Ser. No. 10/982,112, filed on Nov. 5, 2004 now U.S. Pat. No. 7,170,328. Applicants claim benefit of priority under 35 U.S.C.§120 to the above-mentioned patent application.

BACKGROUND OF THE INVENTION

1. Technical Field

The present invention relates to electronic circuits in general, and, in particular, to latch circuits. Still more particularly, the present invention relates to a scannable latch having two cross-coupled NAND gates and a dynamic circuit.

2. Description of Related Art

Scan testings are commonly used to test the functionality of sequential logic circuits within integrated circuits. In typical scan testing approaches, some or all of the storage elements of an integrated circuit are modified to include scan inputs and outputs. In addition, the scan inputs and outputs of the storage elements are connected together in series to form a shift register, i.e., a scan chain. During a scan testing mode, the scan inputs are capable of being selected, and the scan chain are used to apply predetermined input signals to a set of combinational logic.

Specifically, during a scan operation, scan data is shifted into each of the storage elements. The output signals produced by the storage elements are then applied to the combinational logic, and signals produced by the combinational logic are captured by the storage elements. The captured signals produced by the combinational logic are subsequently shifted out of the storage elements of the integrated circuit, and are compared to expected values to determine if the combinational logic had performed a desired logic function.

Latches are typically considered as good candidates to be modified for the purpose of scan testings. This is because latches have relatively simple storage structures capable of transferring signals from inputs to outputs.

There are many ways to make such a latch scannable for the purpose of scan testings. However, the forward delay paths of a latch may be adversely affected if the latch is made scannable. The present disclosure provides a method for making a latch scannable while without sacrificing its forward path delays.

SUMMARY OF THE INVENTION

In accordance with a preferred embodiment of the present invention, a scannable latch includes a dynamic circuit, two cross-coupled NAND gates coupled to the dynamic circuit, and a pair of stacked transistors coupled to the dynamic circuit. One of the stacked transistors is for receiving data signals, and the other stacked transistors is for receiving scan in signals.

In accordance with an alternative embodiment of the present invention, a scannable latch includes a dynamic circuit, two NAND gates coupled to the dynamic circuit, and a pair of transfer gates coupled to the two cross-coupled NAND gates for receiving scan in signals.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
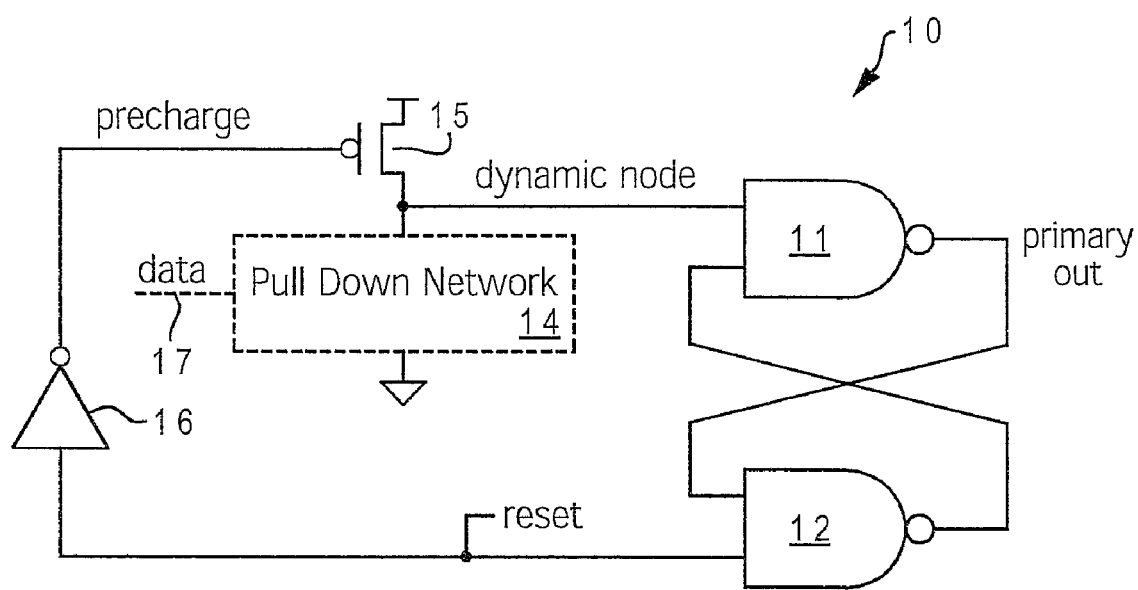
FIG. 1 is a schematic diagram of a latch, in accordance with a preferred embodiment of the present invention.

Referring now to the drawings and in particular to FIG. 1, there is depicted a schematic diagram of a latch in accordance with a preferred embodiment of the present invention. As shown, a latch 10 is formed by two NAND gates 11-12 in conjunction with a dynamic circuit. NAND gates 11-12 are cross-coupled to each other such that the output of NAND gate 11 is fed to one of the two inputs of NAND gate 12, and the output of NAND gate 12 is fed to one of the two inputs of NAND gate 11. The dynamic circuit of latch 10 is represented by a pull-down network 14 coupled to a precharge transistor 15. The output node of the dynamic circuit is sent to the second input of NAND gate 11. The gate of precharge transistor 15 is connected to the second input of NAND gate 12 via an inverter 16. Pull-down network 14 receives data from an input 17. The primary output for latch 10 is from the output of NAND gate 11.

Figure 2:
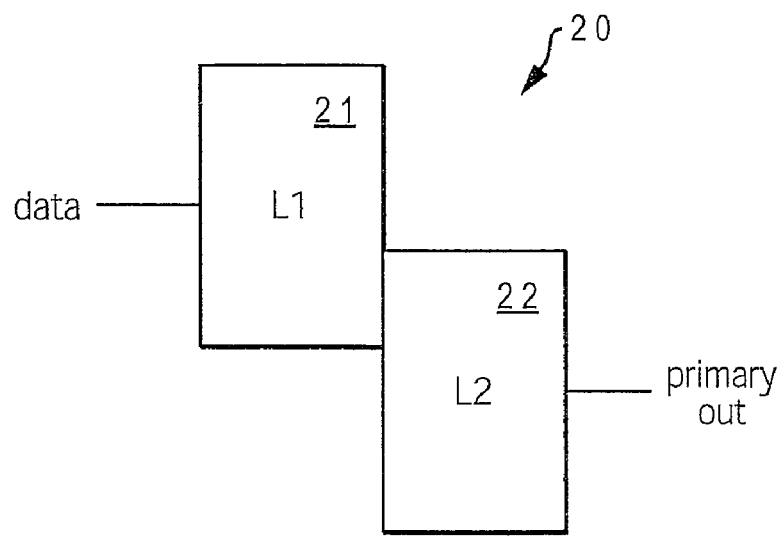
FIG. 2 is a block diagram of the latch from FIG. 1 represented in a latch-pair configuration.

Since a dynamic circuit behaves like a master latch when the dynamic circuit is combined with a pair of cross-coupled NAND gates; thus, latch 10 can be represented by a latch-pair configuration. With reference now to FIG. 2, there is illustrated latch 10 in a latch-pair configuration. As shown, a latch-pair 20 having an L1 latch 21 coupled to an L2 latch 22. Basically, L1 latch 21 is the dynamic circuit from FIG. 1, and L2 latch 22 is cross-coupled NAND gates 11-12 from FIG. 1. Conceptually, there are three methods for making latch-pair 20 scannable.

Figure 3:
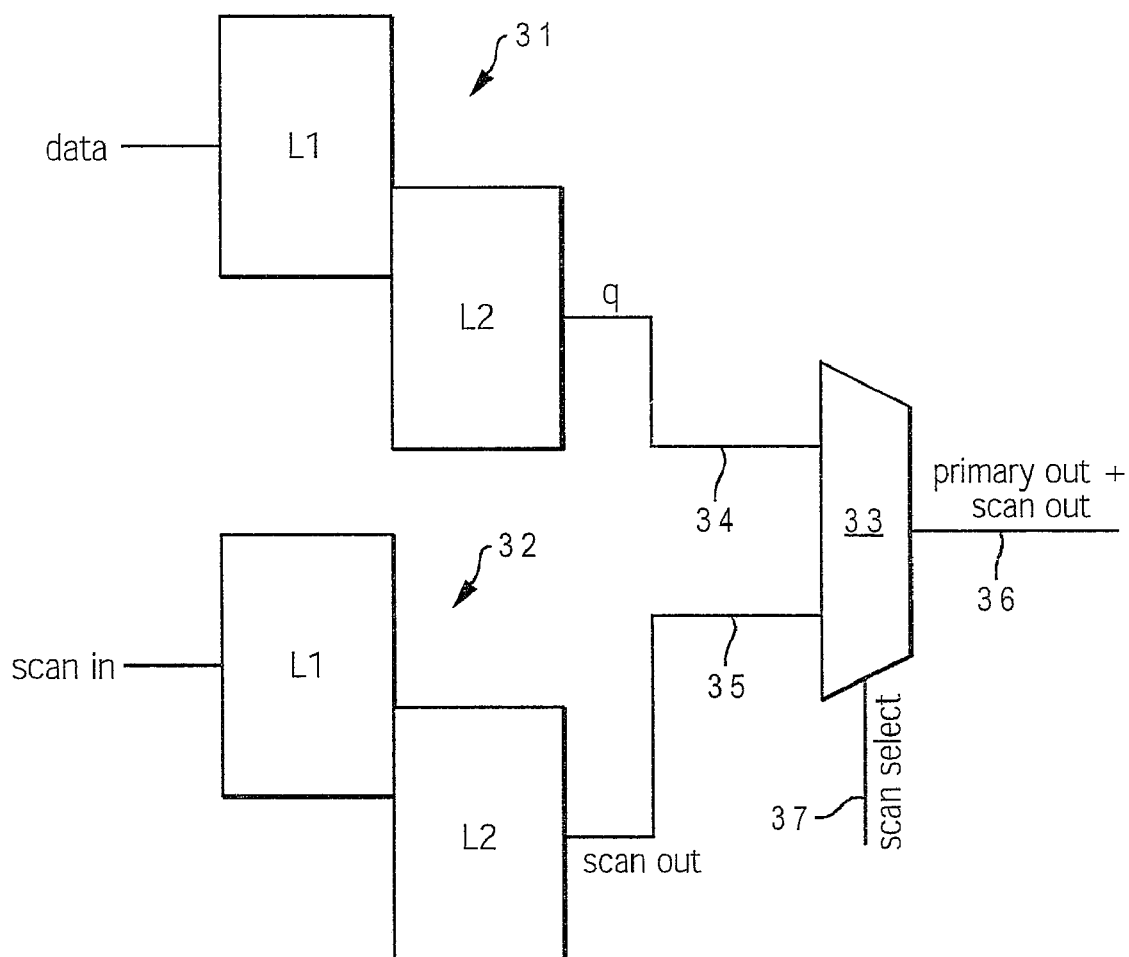
FIG. 3 is a block diagram illustrating a first method for making the latch from FIG. 1 scannable.

The first method for making latch-pair 20 from FIG. 2 scannable is to provide a multiplexor 33 for multiplexing a data out 34 from a first latch-pair 31 and a scan out 35 from a second latch-pair 32, as shown in FIG. 3. In response to a scan select signal 37, multiplexor 33 selects between data out 34 and scan out 35 to provide an output 36.

Figure 4:
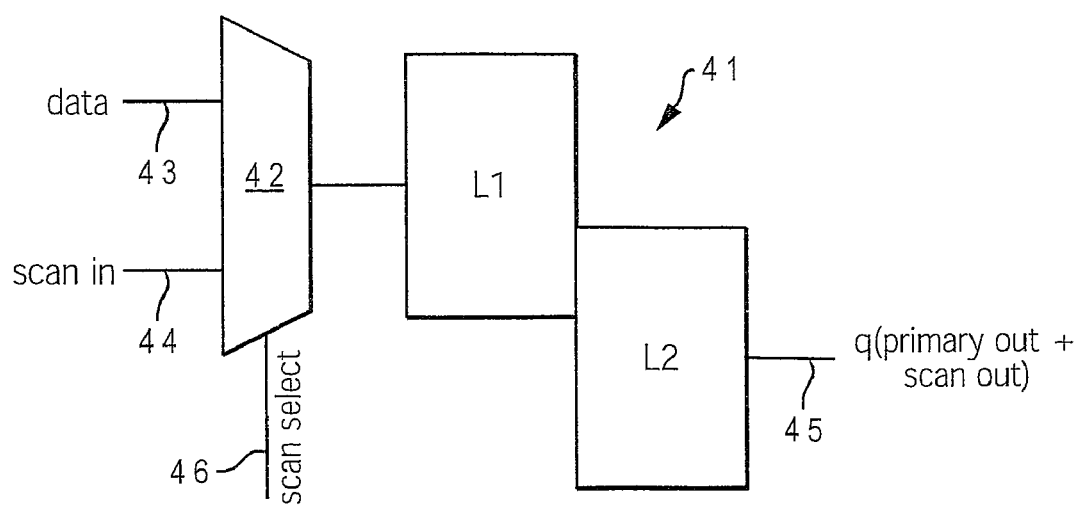
FIG. 4 is a block diagram illustrating a second method for making the latch from FIG. 1 scannable.

The second method for making latch-pair 20 from FIG. 2 scannable is to provide a multiplexor 42 for multiplexing a data input 43 and a scan input 44 to a latch-pair 41, as depicted in FIG. 4. In response to a scan select signal 46, multiplexor 42 selects between data input 43 and scan input 44 to be sent to latch-pair 41 to provide an output 45.

Figure 5:
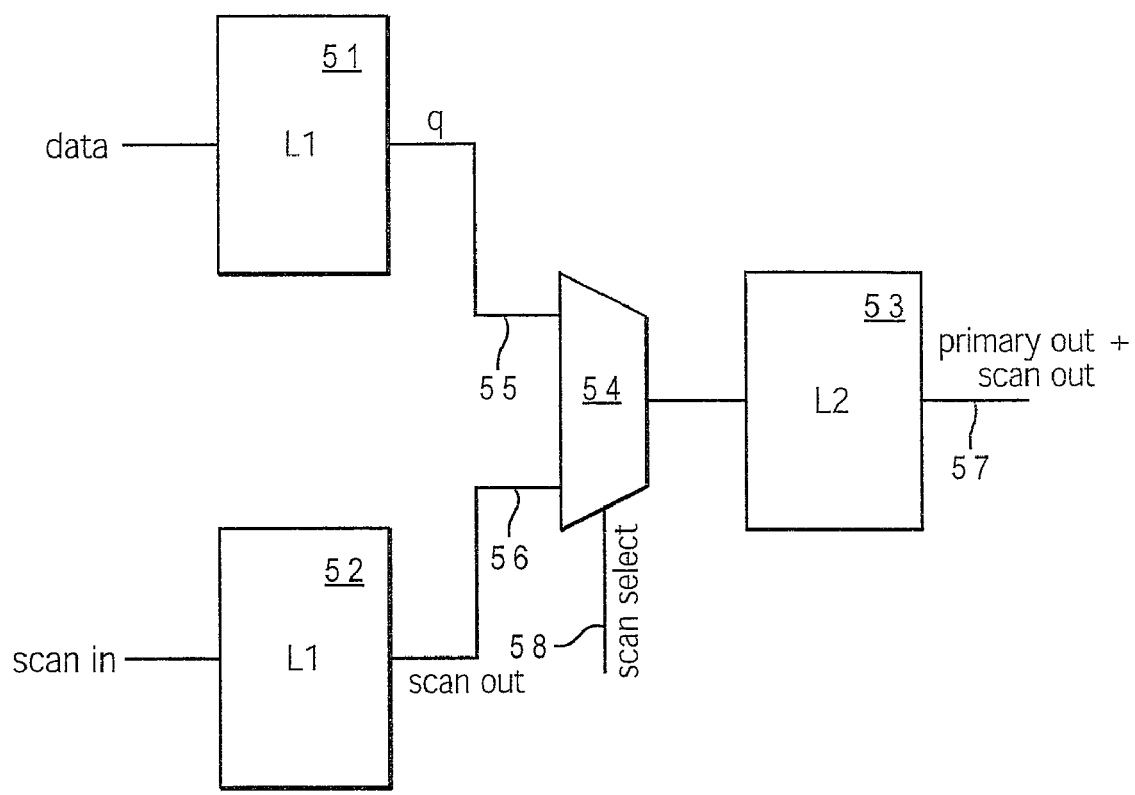
FIG. 5 is a block diagram illustrating a third method for making the latch from FIG. 1 scannable.

The third method for making latch-pair 20 from FIG. 2 scannable is to provide a multiplexor 54 for multiplexing a data out 55 from a first latch 51 and a scan out 56 from a second latch 52, as shown in FIG. 5. In response to a scan select signal 58, multiplexor 54 selects between data out 55 and scan out 56 to be sent to a third latch 53 to provide an output 57.

The first method shown in FIG. 3 generally requires more latches such that additional delays will be added to the forward path. The second method shown in FIG. 4 requires that data input 43 and scan input 44 to be multiplexed before the signals from data input 43 can arrive at the dynamic circuit. Thus, the third method shown in FIG. 5 is the only viable option to make latch-pair 20 from FIG. 2 scannable.

The scannable latch configuration shown in FIG. 5 can be realized by any one of the following two implementations.

Implementation I

A latch having a dynamic circuit located immediately before a pair of cross-coupled NAND gates can be made scannable by adding an additional multiplexor port to the existing dynamic circuit. With reference now FIG. 6, there is illustrated a block diagram of a scannable latch 60 having two cross-coupled NAND gates and a dynamic circuit, in accordance with a preferred embodiment of the present invention. As shown, scannable latch 60 includes a dynamic circuit 61 coupled to a pair of cross-coupled NAND gates 62-63 and a precharge transistor 64. In the present embodiment, dynamic circuit 61 is a four-way dynamic multiplexor having four pairs of stacked n-channel transistors.

For the present implementation, an additional pair of stacked n-channel transistors 65 is added to dynamic circuit 61. A scan select (scan sel) signal is fed to the gate of one of two stacked n-channel transistors 65. L1 latch 52 is used to feed a scan signal to the gate of the other one of two stacked n-channel transistors 65.

Thus, precharge transistor 64 represents L1 latch 51 in FIG. 5, stacked n-channel transistors 65 represent multiplexor 54 in FIG. 5, and cross-coupled NAND gates 62-63 represent L2 latch 53 in FIG. 5.

During a scan testing, all other data select signals within a four-way dynamic multiplexor in dynamic circuit 61 need to be turned off. Although this adds some complexity to the control signal generation logic (not shown), the forward path delay of scannable latch 60 receives a minimum impact as a result. The concept of the present implementation can generally be applied to any dynamic circuit that contains a dynamic multiplexor or a circuit for performing an OR function.

Figure 7:
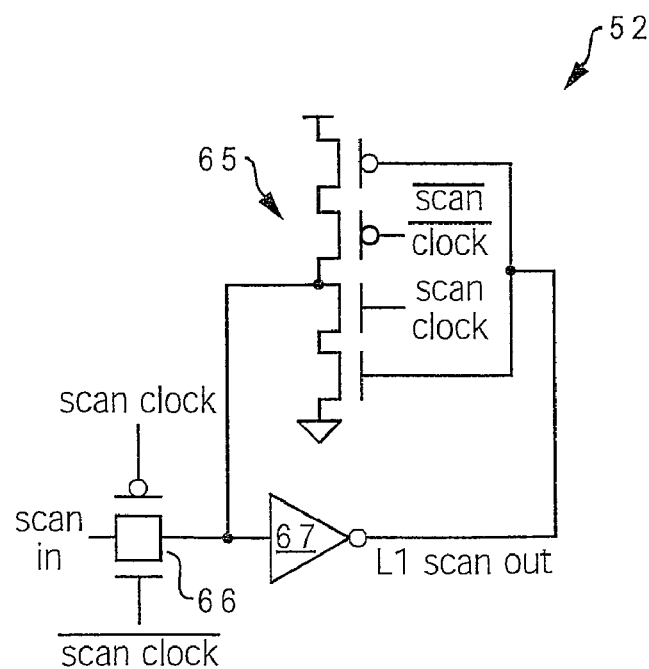
FIG. 7 is a schematic diagram of an L1 latch for connecting to the scannable latch from FIG. 6.

The implementation of L1 latch 52 is illustrated in FIG. 7. As shown, L1 latch 52 includes a set of four stacked transistors 65. Stacked transistors 65 includes two p-channel transistors connected in series with two n-channel transistors. A scan clock signal is fed to the gate of one of the two n-channel transistors of stacked transistors 65. A complement of the scan clock signal is fed to the gate of one of the two p-channel transistors of stacked transistors 65. A scan signal is fed to the gates of the remaining n-channel and p-channel transistors of stacked transistors 65 via a transfer gate 66 and an inverter 67. Transfer gate 66, which includes a p-channel and n-channel transistors, is also controlled by the scan clock signal and its complement.

Figure 6:
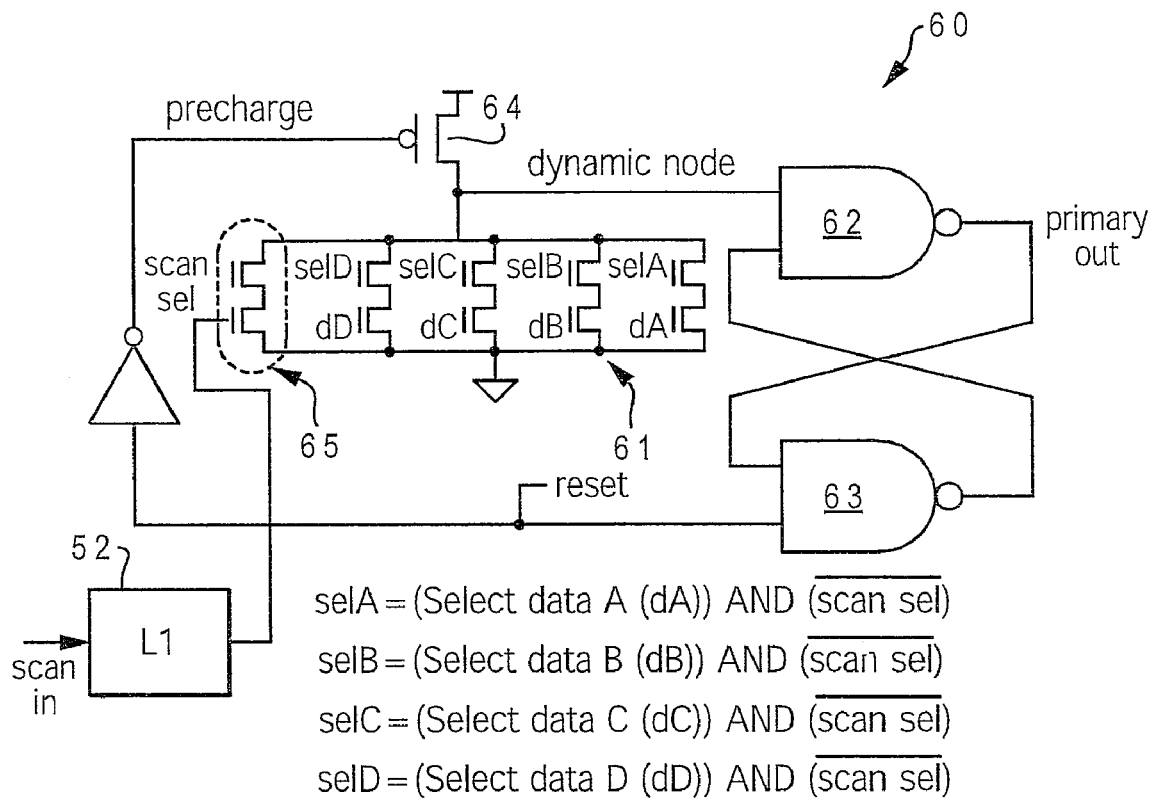
FIG. 6 is a schematic diagram of a scannable latch having two cross-coupled NAND gates and a dynamic circuit, in accordance with a preferred embodiment of the present invention.

The implementation shown in FIG. 6 will not work for a latch having a dynamic circuit that does not contain a dynamic multiplexor or does not contain a circuit for performing an OR function. The implementation shown in FIG. 6 will also not work if an additional pair of stacked n-channel transistor port cannot be included in the dynamic circuit due to some physical constrains. For example, it may be difficult to include additional scan circuit within a memory array or a programmable logic array.

Implementation II

Figure 8:
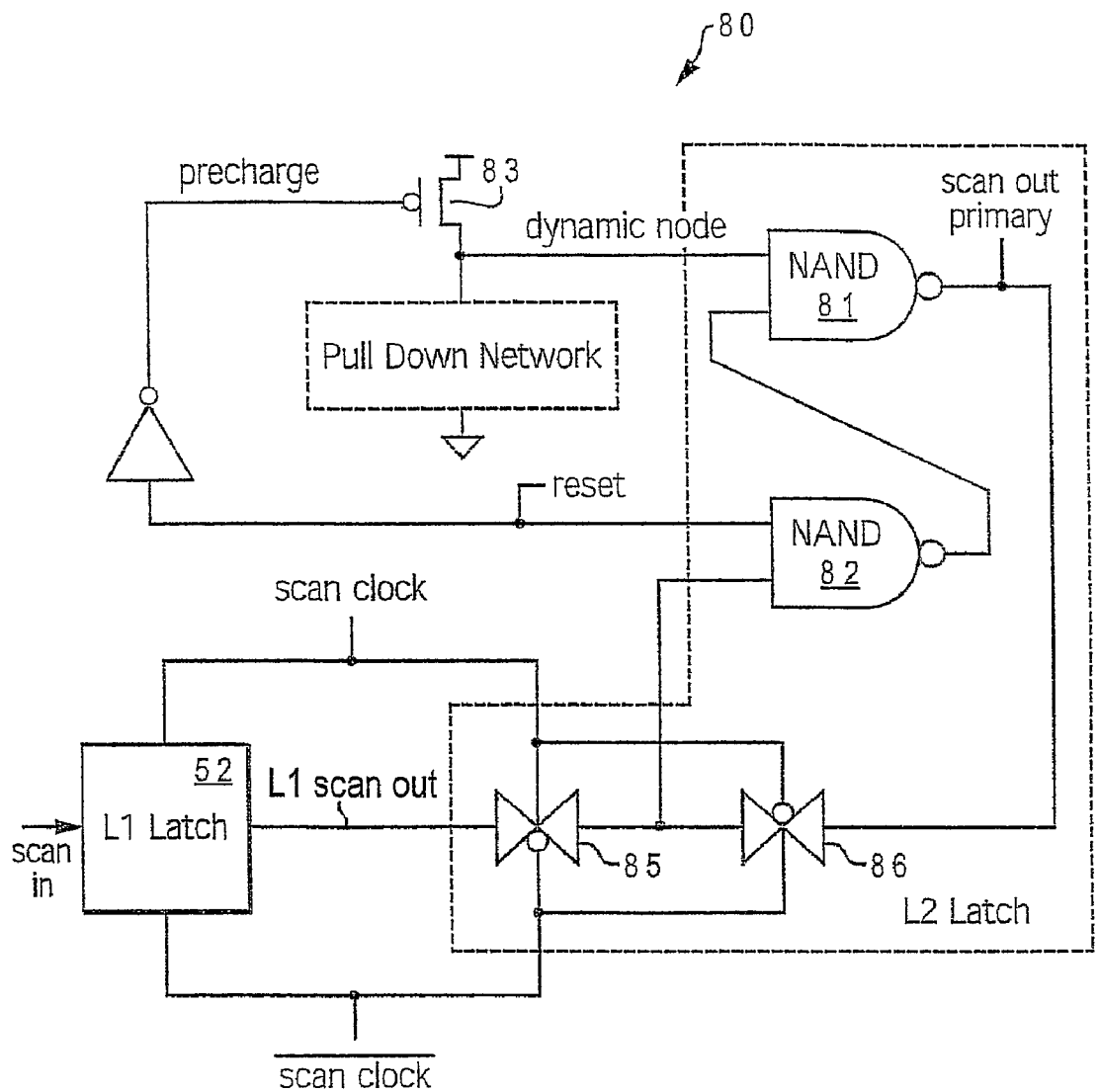
FIG. 8 is a schematic diagram of a scannable latch having two cross-coupled NAND gates and a dynamic circuit, in accordance with an alternative embodiment of the present invention.

The second approach requires additional scan circuitry to be included in the cross-coupled NAND gates. With reference now to FIG. 8, there is depicted a schematic diagram of a scannable latch having two cross-coupled NAND gates and a dynamic circuit, in accordance with an alternative embodiment of the present invention. As shown, a scannable latch 80 includes two cross-coupled NAND gates 81-82, two transfer gates 85-86 and a dynamic circuit 83.

During a normal mode, a reset signal to cross-coupled NAND gates 81-82 is held at a logic low, and a precharge signal to dynamic circuit 83 is held at a logic high. Such is done in a precharge signal generation control block (not shown). Also, a scan clock signal is held at a logic low for turning transfer gate 85 off and for turning transfer gate 86 on, which allows the output of NAND gate 81 to be fed to one of the two inputs of NAND gate 82, and the output of NAND gate 82 to be fed to one of the two inputs of NAND gate 81. As a result, dynamic circuit 83 represents L1 latch 51 in FIG. 5, transfer gates 85-86 represent multiplexor 54 in FIG. 5, and cross-coupled NAND gates 81-82 represent L2 latch 53 from FIG. 5.

Figure 9:
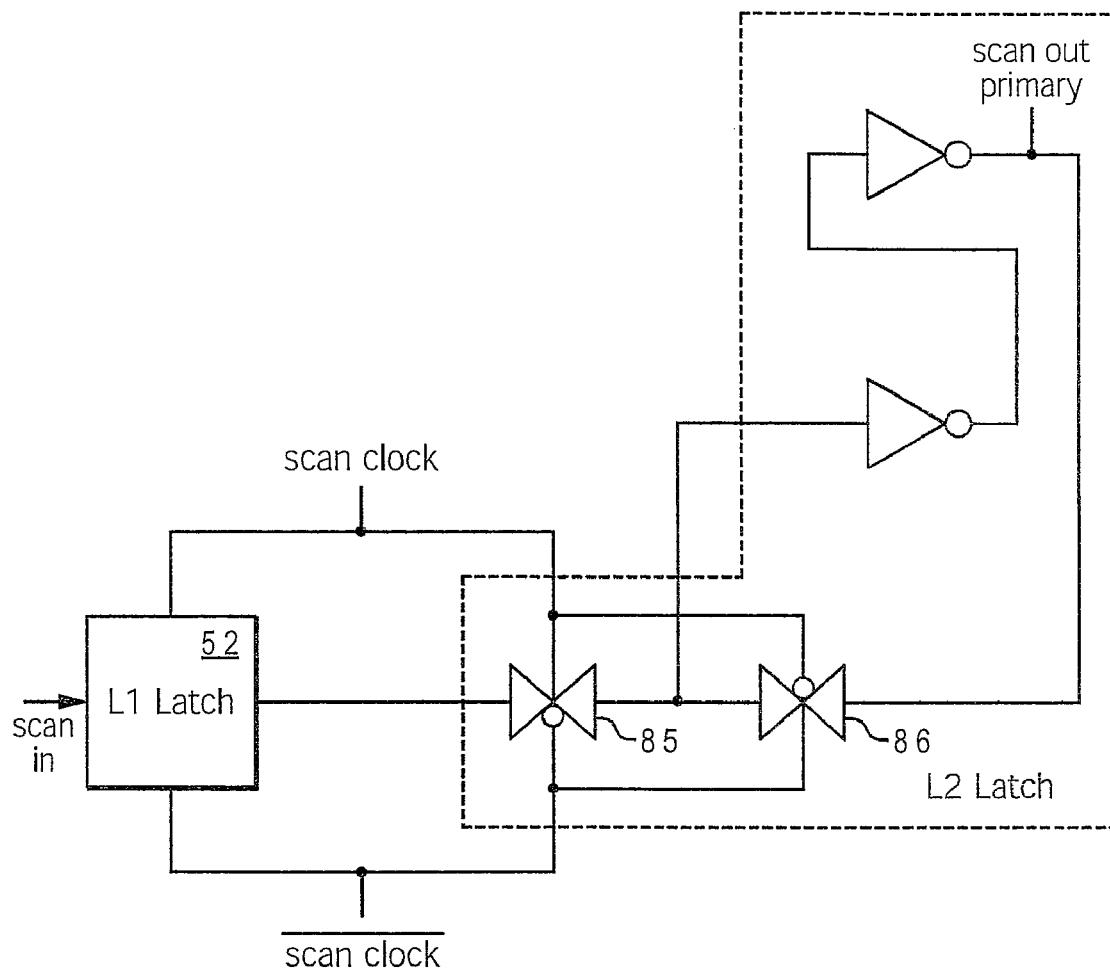
FIG. 9 is a schematic diagram of the scannable latch from FIG. 8 during a scan operation.

During a scan mode, the reset signal to cross-coupled NAND gates 81-82 is held at a logic high, and the precharge signal to dynamic circuit 83 is held at a logic low. The logic low state of the precharge signal makes the dynamic node at precharage transistor 83 go to a logic high. When both the reset signal and the dynamic node are held at a logic high, both NAND gate 81 and NAND gate 82 basically become inverters, as depicted in FIG. 9. Alternating clock signals sent to transfer gate 85 and transfer gate 86 in the feedback path through NAND gate 81 and NAND gate 82 make the portion of scannable latch 80 shown in dashed lines become an L2 latch. Thus, transfer gate 85 and transfer gate 86 are being toggled during the scan period.

As has been described, the present invention provides a scannable latch having two cross-coupled NAND gates and a dynamic circuit.

While the invention has been particularly shown and described with reference to a preferred embodiment, it will be understood by those skilled in the art that various changes in form and detail may be made therein without departing from the spirit and scope of the invention.

What is claimed is:

1. A scannable latch comprising:
   a dynamic circuit;
   a first latch for providing a data out signal from a data in signal; and
   a second latch having two NAND gates coupled to said dynamic circuit and a pair of transfer gates coupled to said two NAND gates for providing a scan out signal from a scan input signal.

2. The scannable latch of claim 1, wherein said dynamic circuit includes a precharge transistor and a pull-down network.

3. The scannable latch of claim 1, wherein an output of a first one of said two NAND gates is connected to a first input of a second one of said two NAND gates, and an output of said second one of said two NAND gates is connected to a first input of said first one of said two NAND gates during a normal mode.

4. The scannable latch of claim 3, wherein said two NAND gates become inverters when second inputs of said two NAND gates are held at a logic high during a scan mode.

5. The scannable latch of claim 1, wherein said scannable latch generates an output at said first one of said two NAND gates.

6. The scannable latch of claim 1, wherein said scan input signal is provided to said transfer gates via an L1 latch.

7. The scannable latch of claim 1, wherein said transfer gates are being toggled during a scan mode.

* * * * *